United States Patent [19]

Serio, Jr.

[11] Patent Number: 5,031,791
[45] Date of Patent: Jul. 16, 1991

[54] ELECTRONIC ENCLOSURE CASE

[75] Inventor: Donald L. Serio, Jr., Fontana, Calif.

[73] Assignee: Serco Mold, Inc., Covina, Calif.

[21] Appl. No.: 350,332

[22] Filed: May 9, 1989

[51] Int. Cl.$^5$ ............................................. A45C 13/10
[52] U.S. Cl. .................................... 220/281; 220/324; 206/807
[58] Field of Search ............... 220/4 A, 281, 282, 283, 220/324; 206/807

[56] References Cited

U.S. PATENT DOCUMENTS

| | | | |
|---|---|---|---|
| 3,907,103 | 9/1975 | Shaw | 220/281 |
| 4,048,050 | 9/1977 | Hillman | 220/281 |
| 4,174,034 | 11/1979 | Hoo | 220/281 |
| 4,381,836 | 5/1983 | Rivkin et al. | 206/807 |
| 4,401,210 | 8/1983 | Anjou | 220/281 |
| 4,634,004 | 1/1987 | Mortensen | 206/807 |
| 4,805,769 | 2/1989 | Soltis et al. | 206/807 |

*Primary Examiner*—Joseph Man-Fu Moy
*Attorney, Agent, or Firm*—Robert J. Schapp

[57] ABSTRACT

An electronic enclosure case comprised of first and second case sections or so-called "shells" having mating abuttable rims. A plurality of spaced apart hooks extend outwardly from the rim on one of the case sections and are adapted for insertion into openings formed in the rim of the opposite case section. The hooks and the openings are sized and shaped so that the hooks will extend into the openings to enable the rims to abut against one another. When one of the case sections is thereafter moved in a plane parallel to the surface of the rims relative to the other case section, the hooks become latched in the openings and, there is a tight fitting retention of the two case sections so that the electronic enclosure casing cannot be unauthorizedly opened. The hooks and the openings are further constructed so that by squeezing the side walls on one of the case sections, the hooks will become released from the openings. In this way, only those parties having knowledge of the means for opening the case will have access to the interior thereof. The present invention also provides a unique cover plate which is adapted to extend over a portion of the casing and a unique battery case extending over a battery compartment.

20 Claims, 6 Drawing Sheets

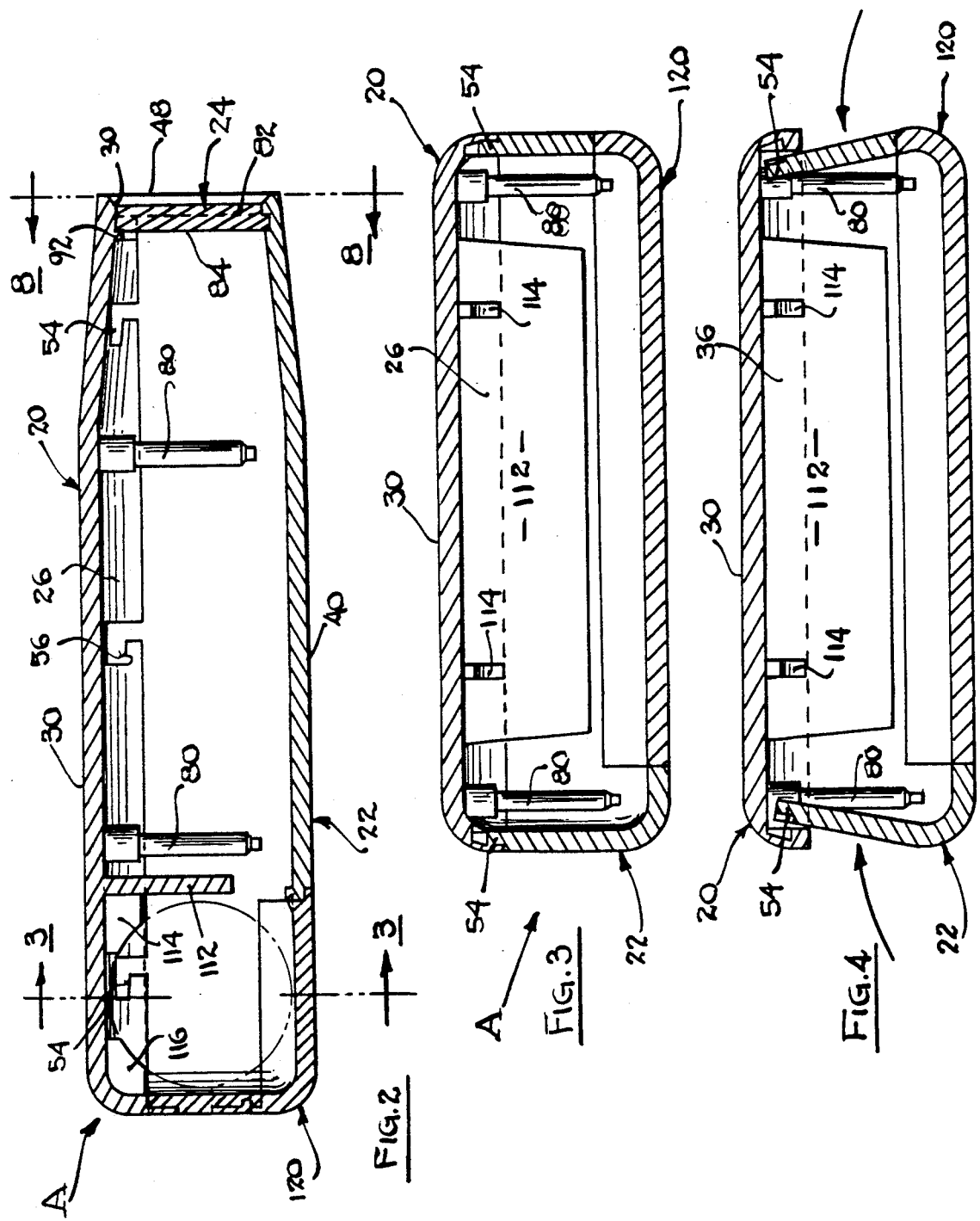

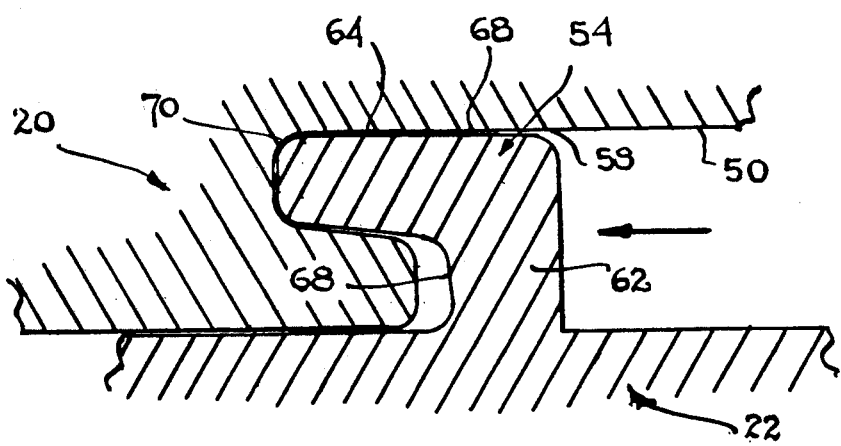
Fig. 5
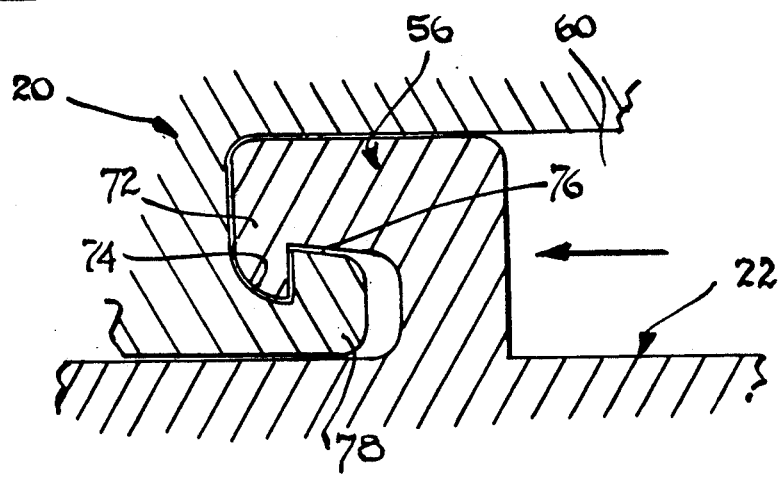
Fig. 6
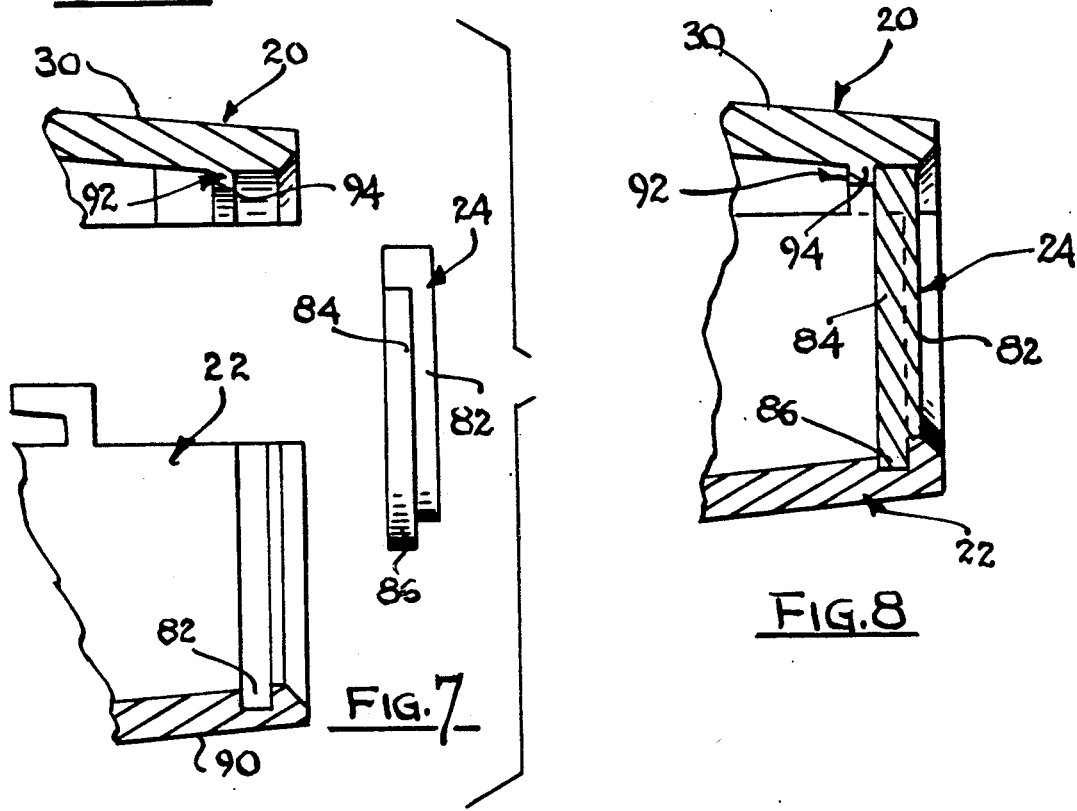
Fig. 7
Fig. 8

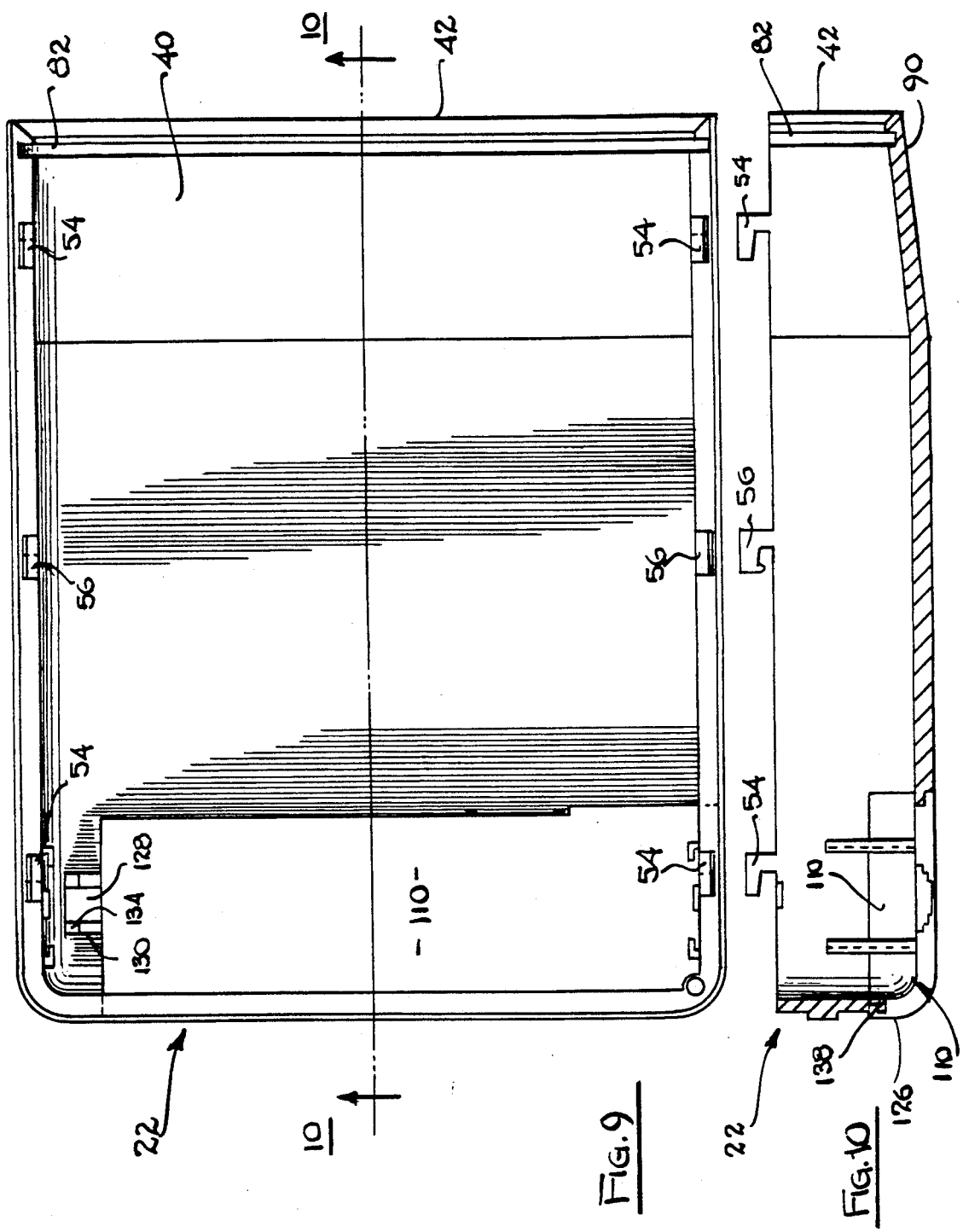

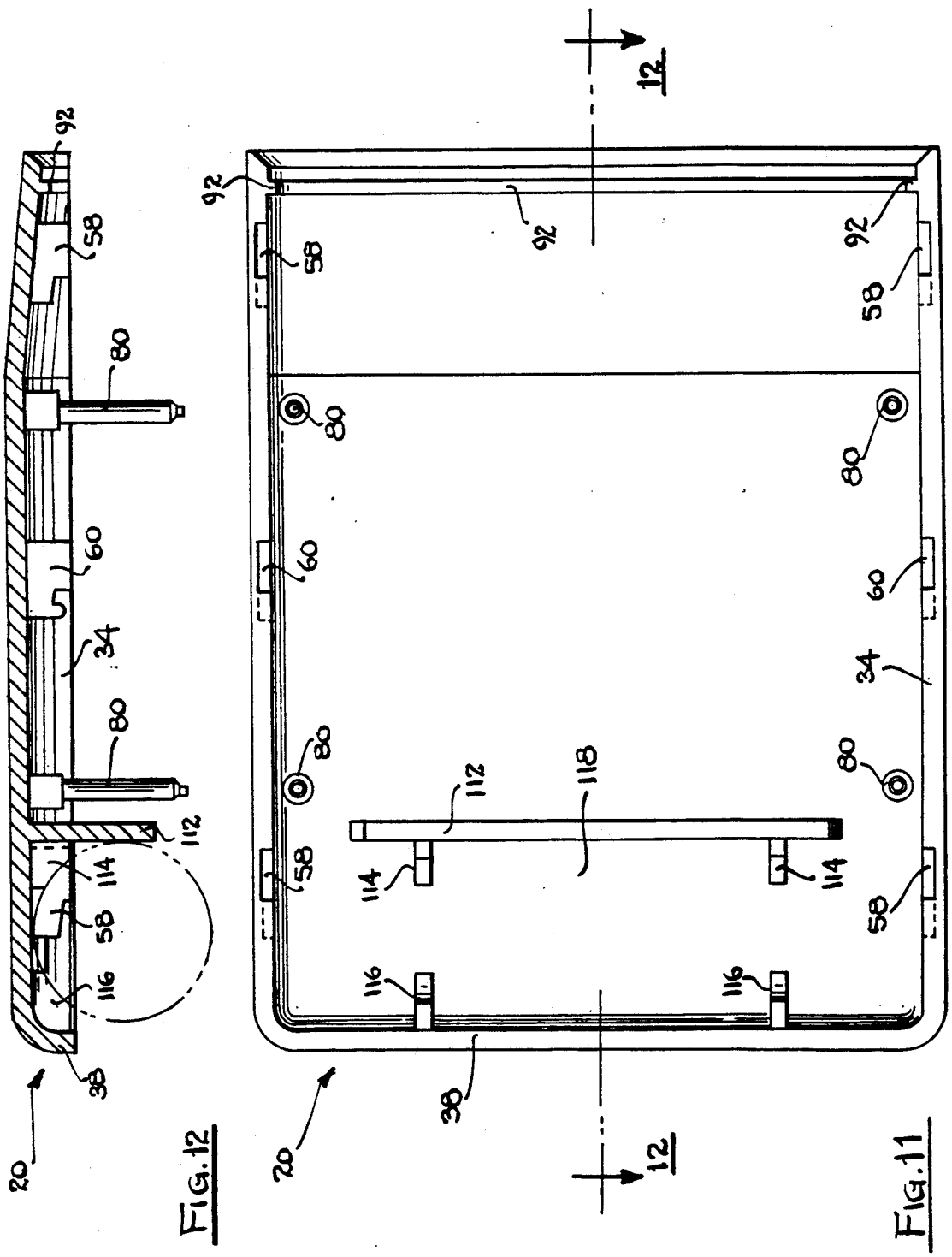

ELECTRONIC ENCLOSURE CASE

BACKGROUND OF THE INVENTION

1. Field of the Invention

The invention relates in general to certain new and useful improvements in electronic enclosure cases, and more particularly, to electronic enclosure cases which are comprised of a pair of mating abuttable shells and which are relatively incapable of being unauthorizedly opened and which also have a unique construction so that they can be used for housing a number of different electronic components and circuits without material alteration of the case.

2. Brief Description of the Prior Art

There are numerous commercially available case constructions for housing and containing various electronic apparatus. Many types of electronic apparatus usually contain individual discrete electronic components which are hard-wired in a desired electrical pattern or otherwise, they are comprised of one or more circuit boards containing those chips or components necessary to perform the desired electronic circuit functions.

Electronic enclosure cases of this type have found widespread use in numerous applications including, for example, handheld remote control access devices or so-called "beepers", remote control auto security system actuators, garage door openers and the like. Electronic circuitry and components contained in relatively small enclosure cases have also been used in the health industry, as for example, in the housing of the electronics for cardiac monitors and the like.

In many cases, it is desirable to preclude access to the electronic components or circuits contained within the electronic enclosure housing or casing. It may be necessary to periodically change the batteries which provide the electrical power for the circuits. However, a separate battery compartment is usually provided for this purpose. Nevertheless, and in many cases, whether or not failure may be due to a weak battery, the user of the device will oftentimes attempt to self-diagnose any problem, and in many cases will damage the electronic components or the circuitry involved.

In order to preclude access to the interior of these electronic component casings, many manufacturers have resorted to mechanical fasteners such as screws which have less common types of screw heads, such as the Allen wrench heads or the Phillips heads. However, many consumers have access to tools of these types and are therefore able to obtain ready access to the interior of the electronic enclosure casing.

Other means for precluding access to the interior of the electronic enclosure casings have also been used with varying degrees of success. However, many of these other means for securing the casing almost necessarily make it more difficult and time consuming for authorized personnel, such as repair personnel, to open the casing.

Thus, there has been a need for an electronic enclosure casing which is capable of being rapidly and easily opened by authorized personnel bu which is relatively incapable of being opened for access to the interior thereof by unauthorized persons.

It would be desirable to provide a two-piece electronic component casing which could be of standardized construction inasmuch as this type of casing would materially reduce the overall cost of manufacture and hence the cost to the consumer. However, in many cases, the manufacturers of the electronic devices who utilize the electronic component casings have differening requirements, as for example, various controls which may be provided on the exterior of the casing for manual operation. Otherwise, the various manufacturers of electronic devices utilizing these casings may include jack outlets or the like on the exterior of the casing for connection to some external source of power or otherwise some auxiliary equipment. Thus, there has been no effective way to provide a standardized casing which can be used by a large number of electronic device manufacturers for the housing of their electronic components.

OBJECTS OF THE INVENTION

It is, therefore, one of the primary objects of the present invention to provide an electronic component casing comprised of a plurality of shells which are capable of being snap-fitted together but which are relatively un-openable by unauthorized personnel who do not have knowledge of the techniques used to open the casing.

It is another object of the present invention to provide a electronic enclosure casing comprised of a plurality of shells of the type stated in which hook-like elements on one shell fit into recesses in another shell in a unique arrangement such as to form a type of lock which is not openable by unauthorized personnel who do not have knowledge of the means to remove the hook-like elements from the recesses.

It is a further object of the present invention to provide an electronic enclosure casing of the type stated which has a uniquely arranged separate battery compartment and with a battery cover which can be removable to provide access to batteries without disrupting the security of the portion of the casing which encloses electronic circuitry and other electronic components.

It is still another object of the present invention to provide an electronic enclosure casing of the type stated with interchangeable end plates such that one enclosure casing can serve a multitude of uses and conform to the requirements of a large number of electronic component casing users.

It is another salient object of the present invention to provide an electronic enclosure casing of the type stated which can be produced at a relatively low cost but which is highly efficient in its operation.

It is still another object of the present invention to provide an electronic enclosure casing of the type stated which may be made in a variety of sizes and which may be made with waterproof construction and the like.

With the above and other objects in view, my invention resides in the novel features of form, construction, arrangement and combination of parts presently described and pointed out in the claims.

BRIEF SUMMARY OF THE DISCLOSURE

A two-shell electronic enclosure casing for containing electronic components or circuits and which shells are not readily separable without knowing a generally non-disclosed means for separating the same. In a broad aspect, the non-disclosed means for separating or opening the two shells relies upon an arrangement in which hooks on one shell are fitted into openings on the opposite and mating shell. The hooks are inserted in such manner that they cannot be released without knowing the technique for shifting at least one of the shells relative to the other.

In a broad aspect, the electronic enclosure casing comprises a first shell having a first rim with means forming a plurality of openings spaced along at least a portion of this first rim. The casing also comprises a second shell having a second rim which is capable of being disposed in juxtaposition and preferably in mating engagement with the first rim. In this way when the rims of the two shells are abutted together, they form a casing with an interior compartment sized to receive electronic circuits or components.

A plurality of hooks ar spaced along at least a portion of the second rim. Each of these hooks have a thickness such that they fit into the openings and which hooks are movable in the openings along a longitudinal dimension of the rim to a position where they are retentively held within the openings, and so that the two shells are lockably held together. One of the rims is somewhat yieldable enabling its transverse dimension to be changed so that the hooks can be readily removed from the openings thereby permitting separation or opening of the two shells.

In a more preferred embodiment of the invention, the hooks are not lockably held within the openings until they are fully inserted into the openings and one of the shells is shifted longitudinally relative to the other. Moreover, as indicated above, the hooks cannot be removed until one of the rims is shifted yieldably with respect to the other. In this case, the somewhat shiftable yielding occurs when the rim containing the hooks is squeezed so that the hooks can be readily removed from the openings.

The hooks preferably have a first section which extends outwardly toward the first shell and a second section which is located at approximately right angles to the first section. The second section is preferably parallel to the portion of the rim from which they extend. The openings also have a first elongate section sized to receive both the first and second sections of the hooks. The second section, however, is not directly open to the rim. However, the second section of the opening receives a second section of the hook when the two shells are shifted relative to one another.

Generally there are two types of hooks which are used on the rim of the second shell. A first type and a second type of hooks are generally similar in construction except that the second type of hooks include downwardly struck tabs, that is tabs which extend toward the second rim. In this way, the hooks with the tabs are adapted to lockably hold the first and second shells to preclude any sliding movement after they are initially shifted relative to one another.

The two-shell casing for the containment of electronic components or circuits also comprise a flat wall on the first shell with an outwardly struck rim forming side wall defining a first rim thereon. The second shell also has a flat wall spaced apart from the flat wall of the first shell. The second shell similarly has an outwardly struck rim-forming side wall with a second rim adapted for juxtaposed engagement with the first rim. Further, the rim-forming side walls extend only around a portion of the periphery of the casing, leaving an opening along the side which would have been closed if the side walls were continuous.

The flat wall of the second shell and a portion of the rim-forming side wall of the second shell have a groove which is formed therein. An end plate is sized to extend over the opening along the rim-forming side walls to completely enclose the casing. A flange extends outwardly from the end plate and is located to fit within the groove In accordance with this construction, the end plate cannot be removed without first separating the first and second shells.

In accordance with this construction, a plurality of different end plates could be provided. The end plate may have certain labelling or certain input/output requirements thereon for a particular application. Thus, one end plate can be capable of being interchangeable with another end plate having the flange and this other end plate may have other labelling or input/output requirements thereon for another application.

In a preferred embodiment, the flat walls are rectangularly shaped and the rim-forming side walls extend around three sides of the flat walls. In this way, the end plate constitutes a side wall along the fourth side of the flat walls. The groove formed in the flat wall of the second shell and the rim-forming side wall is located near an edge of the flat wall and the rim-forming side wall. The flange extends along one edge of the end plate and a portion of two sides of that end plate to thereby capture the end plate in the groove in the flat walls and the rim-forming side wall.

The electronic enclosure casing of the present invention also provides a battery compartment with a removable battery compartment cover plate. The battery compartment cover plate is provided with a flange on one edge which extends into a groove formed in one of the flat walls and the rim-forming side wall. The cover plate also has a somewhat U-shaped groove which fits into a corresponding flange on the flat plate of the opposite shell and is retentively held in this position.

This invention possesses many other advantages and has other purposes which may be made more clearly apparent from a consideration of the forms in which it may be embodied. These forms are shown in the drawings forming a part of and accompanying the present specification. They will now be described in detail for the purposes of illustrating the general principles of the invention, but it is to be understood that such detailed description is not to be taken in a limiting sense.

BRIEF DESCRIPTION OF THE DRAWINGS

Figure 1:
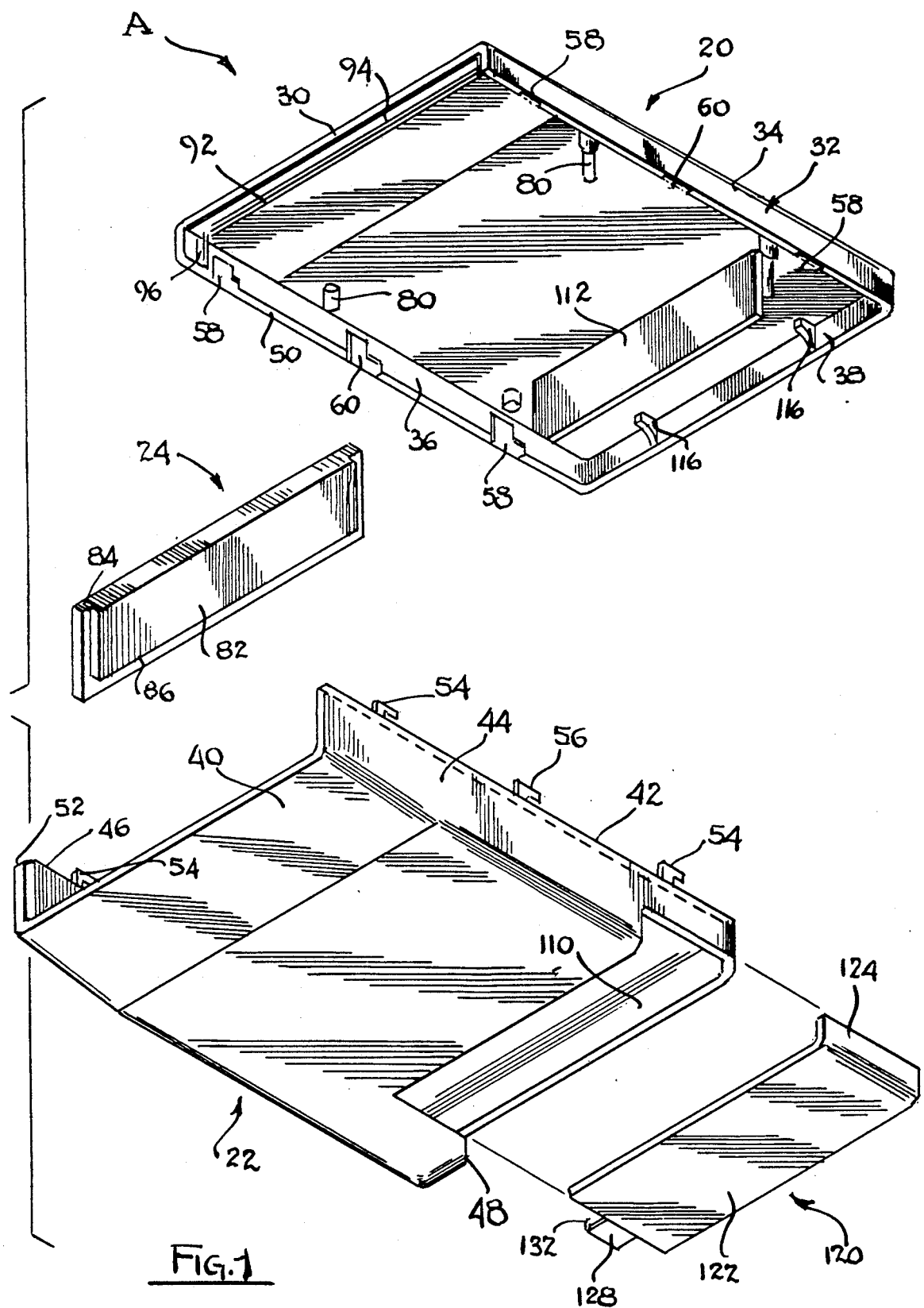
Figure 13:
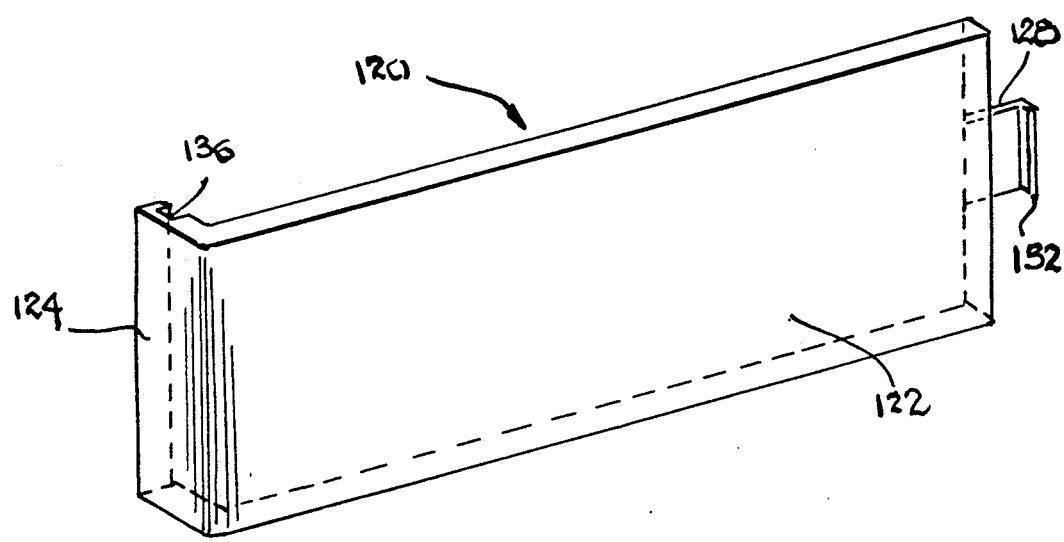

Having thus described the invention in general terms, reference will now be made to the accompanying drawings (six sheets) in which:

FIG. 1 is an exploded perspective view showing the major components forming part of the electronic enclosure casing of the present invention;

FIG. 2 is a longitudinal sectional view of the electronic enclosure casing with the two shells thereof fitted together;

FIG. 3 is an enlarged vertical sectional view taken along line 3—3 of FIG. 2;

FIG. 4 is an enlarged vertical sectional view, similar to FIG. 3, and showing the rim-forming side wall of one of the shells in a distorted condition to permit separation of the two shells;

FIG. 5 is an enlarged detail sectional view showing one of the hooks used on one of the shells for fitting into an opening in the other of the shells;

FIG. 6 is a sectional view, somewhat similar to FIG. 5, and showing another type of hook on one of the shells for fitting into an opening in the other of the shells;

FIG. 7 is a fragmentary exploded sectional view showing the end plate and the shells forming part of the electronic enclosure casing of the present invention;

FIG. 8 is a fragmenting sectional view similar to FIG. 7 and showing the shells and end plate in the assembled arrangement;

FIG. 9 is a top plan view showing the interior of the lower shell forming part of the electronic enclosure casing of the present invention;

FIG. 10 is a vertical sectional view taken along line 10—10 of FIG. 9 and showing the lower shell of the casing of the present invention;

FIG. 11 is a bottom plan view showing the interior of the upper shell forming part of the electronic enclosure casing of the present invention;

FIG. 12 is a vertical sectional view taken along line 12—12 of FIG. 11 and showing the upper shell forming part of the electronic enclosure casing of the present invention; and FIG. 13 is a perspective view showing a battery compartment cover case for disposition over a battery compartment opening formed in the electronic enclosure casing of the present invention.

DETAILED DESCRIPTION OF A PREFERRED EMBODIMENT

Referring now in more detail and by reference characters to the drawings which illustrate a practical embodiment of the present invention, A designates an electronic enclosure casing which is comprised of several unique features as hereinafter described with reference to the drawings.

The electronic enclosure casing is comprised of an upper shell 20 and a lower shell 22. The electronic enclosure casing is also comprised of an end plate 24, as illustrated in FIGS. 1-3 of the drawings. The two shells 20 and 22, along with the end plate 24, constitute the major components of the electronic enclosure casing and when assembled together, form an interior compartment 26 sized to receive electronic components or circuits (not shown).

1. Two Shell Construction

The first shell 20, which may be an upper shell or top shell in the arrangement as illustrated, comprises a flat top wall 30 and a rim-forming side wall 32 which extends around three sides of the rectangularly shaped top wall 30. In this way, the rim-forming side wall 32 is not continuous leaving an open end along one margin of the top wall 30. Thus, the rim-forming side wall 32 is comprised of laterally spaced apart upper side walls 34 and 36 connected by a rim-forming upper end wall 38.

The second shell 22, which constitutes a lower shell in the arrangement as illustrated, also comprises a flat bottom wall 40 and which is also generally rectangular in shape, except for a cut-out portion, as hereinafter described. A rim-forming side wall 4 is integral with the bottom wall and extends upwardly therefrom so that it may lie in abutting contact with the rim-forming side wall 32. In this case, the rim-forming side wall 42 comprises a pair of lower side walls 44 and 46 along with a relatively short transverse end wall 48. Thus, one end portion of the lower shell 22 is opened on the same end as the upper shell 20.

The upper rim-forming side wall 34 has a lower edge which constitutes a downwardly presented rim 52. In like manner, the rim-forming side wall 42 has an upper edge which constitutes an upwardly presented rim 52. The upper rim 50 constitutes and is often referred to as a "first rim". In like manner, the lower rim 52 constitutes and is often referred to as a "second rim".

Integrally formed with the side walls 44 and 46 on the rim 52 are a plurality of hooks comprising a first type of hook 54 and a second type of hook 56. In the embodiment as illustrated, a pair of the first type of hooks 54 is also shown on the side wall 44 and a pair of hooks 54 is shown on the side wall 46. In like manner, a single second type of hook 56 is shown on the side wall 44 and a single second type of hook 56 is located on the side wall 46. The rim 50 is provided on the side walls 34 and 36 with openings to receive the hooks 54 and 56. In this case, the rim 50 is provided with a first pair of openings 58 sized and located to receive the hooks 54 and a second opening 60 sized and located to receive the hooks 56 in each of the upper side walls 34 and 36.

Referring now to FIGS. 2 and 5 of the drawings, it can be observed that the first type of hook 54 comprises a first section 62, which is upwardly projecting and a second section 64 which is generally horizontally disposed and located at approximate right angles with respect to the hook sections 62. The opening 58 is also best illustrated in FIGS. 2 and 5 of the drawings and has a first portion 68 which is sized to receive both of the sections 62 and 64 of the hook 54. In like manner, the opening 60 has a second section 70 sized only to receive a portion of the section 64 of the hook, as best illustrated in FIG. 5 of the drawings. It ca be observed that when the two shells are initially fitted together and the hook 54 is inserted into the opening 60, the hook 54 will initially fit directly into the enlarged opening and will be located to the right of the position shown in FIG. 5. However, when the two shells are shifted longitudinally relative to one another, the hook 54 will move to the position as shown in FIG. 5.

The hook 56 is more fully illustrated in FIGS. 2 and 6 of the drawings. In this case, the hook 56 is similar to the hook 54, except that it includes a downwardly struck tab 72 as best illustrated in FIG. 6. Moreover, the tab 72 fits within an upwardly projected recess 74 formed in the second section 70 of the opening 60. In accordance with this construction, when the two shells are longitudinally shifted relative to one another, the tab 72 will drop into the recess 74, thereby retentively holding the two shells together and precluding any further shifting movement. In this case, the tab 72 is somewhat resilient so that it can shift over a camming surface 76 formed in a projection 78 on the casing as shown in FIG. 6.

With reference to FIGS. 3 and 4, it can be observed that the hook receiving openings 58 and 60 are closed to the exterior of the rim-forming side wall 32 of the casing. However, the openings 58 and 60 are in direct communication with the interior compartment 26 as shown. As indicated previously, when the two shells have been shifted relative to one another, the hooks 56 will preclude any further shifting movement. This will prevent any unauthorized separation of the two shells since the user will not be able to shift the two shells relative to one another and thereby remove the hooks 54 and 56 from the respective openings 58 and 60. Moreover, the hooks 54 and 56 in the corresponding openings 58 and 60 generally have a construction which presents a non-disclosed means for separating the same. In this case, the two shells can be separated from one another merely by squeezing on the exterior surface of each of the lower shells on each of the lower side walls 44 and 46. Upon squeezing, the hooks 54 and 56 will be moved laterally out of the respective openings 58 and 60 and into the interior compartment 26. In this way, the two shells 20 and 22 can be readily separated from one another without any sliding movement.

This latter means of opening the two shells is generally a non-disclosed means. In this way, there can be little or no unauthorized opening of the two shells since the user is not likely to be able to determine the means for opening the same unless the user has been previously informed of this means for separating the two shells.

Located on the interior surface of the top wall 30 are a plurality of downwardly projecting pins 80 which extend into the interior compartment 26. The lower ends of the pins 80 are adapted to engage the upper surface of the bottom wall 40. In this way, the pins 80 will maintain a separation of the top wall 30 and the bottom wall 40 and prevent an inadvertent squeezing of the same together. Moreover, the pins 80 may also function as guide pins by fitting into recesses (not shown) on the upper surface of the bottom wall 40, if desired.

When the two shells 20 and 22 are fitted together and retentively held in the locked position, a face plate 24 may be disposed within the opening at one of the transverse end walls, as shown in FIGS. 1 and 2 of the drawings. This face plate 24 will thereby completely enclose the interior compartment 26.

2. Interchangeable Face Plates

In many cases, users of the electronic enclosure casing of the invention require certain identification information on the exterior surface of the face plate 24. Otherwise, jacks or various jack openings or the like may be included on the exterior surface of the face plate 24 depending upon the particular application of the electronic enclosure casing A. In accordance with the present invention, it has been found that one particular electronic enclosure casing may fit a variety of applications, only with the need for changing of the end plate 24. In this way, a variety of end plates 24 may be formed with each one of the end plates being adapted for fitting into the opening at the left-transverse end, reference being made to FIG. 1, for a particular application. In addition custom made face or end plates 24 may also be provided.

The face plate 24 is generally rectangular in shape as best illustrated in FIGS. 1 and 13. The face plate 24 comprises an exteriorly presented plate section 82 and an enlarged plate section 84 as best illustrated in FIGS. 7 and 8 of the drawings. The interiorly presented plate section 84 extends beyond the exteriorly presented plate section 82 along the vertical side margins and the lower margin, thereby providing a projecting flange 86 which extends along the lower margin and the vertical side margins of the face plate 24. By further reference to FIGS. 1, 2, 7 and 8 of the drawings, it can be observed that the projecting flange 86 on the face plate 24 fits within a groove 88 formed in the bottom wall 40 and a corresponding pair of grooves 90 formed within the rim-forming side wall 42. In this way, the projecting flange 86 will fit within the groove 88 and the pair of opposed grooves 90, with the plate section exterior face 82 facing outwardly.

The upper shell 20 is provided on its top wall and on the rim-forming side wall 32 with a somewhat inverted U-shaped flange 92. More specifically, this flange 92 includes a downwardly projecting flange section 94 formed on the top wall 30 and a pair of inwardly projecting opposed flange sections 96 formed on the rim-forming side wall 32. These flange sections 94 and 96 will engage the interiorly presented surface of the plate section 84, as best illustrated in FIGS. 2, 7 and 8 of the drawings.

It can be observed that the two shells are tapered at the right-hand end, reference being made to FIGS. 2, 10 and 12 of the drawings. In this way, when the face plate 24 is fitted between the two shells, and the two shells are then connected together, by means of the hooks as previously described, the face-plate 24 will be rigidly retained as an end wall. Moreover, it is possible to easily and conveniently remove this face plate 24 by separating the two shells in the manner as previously described.

It should also be observed that FIG. 1 was reversed in orientation compared to the remaining figures. For example the taper is shown in the right-hand end in FIGS. 7 and 8. This reverse orientation of FIG. 1 was presented in order to more fully illustrate the principles of the invention.

3. Battery Compartment

The electronic enclosure casing A of the present invention is also provided with a battery receiving compartment 110 formed in the lower shell 22 as best illustrated in FIGS. 1, 2, 9 and 10 of the drawings. The battery compartment 110 is defined by the end wall and portions of the rim-forming side walls 36, as well as a downwardly projecting plate 112 formed on the interior of the upper shell 20. The plate 112 will engage the upper surface of the bottom wall 40 when the two shells are fitted together, thereby defining a complete battery compartment 110 (FIG. 11).

Projecting toward the upper end wall 38 and being integrally formed with the downwardly projecting plate 112 are pairs of spaced apart outwardly extending flanges 114. By reference to FIG. 11, it can be observed that the flanges 114 are in alignment with a similar pair of spaced apart inwardly projecting flanges 116 integral with the interior surface of the upper end wall 38 and thereby defining a battery receiving space 118.

A battery cover 120 is provided for releasable disposition over the opening which leads to the battery compartment 110. In this respect, the opening is formed by a cut-away portion of the lower shell 22 as best illustrated in FIG. 1 of the drawings. The battery compartment cover plate, 20 is provided with a cover plate lower wall 122 and an integrally formed upwardly projecting side wall section 124. Moreover, the battery compartment cover plate 120 is provided with an upwardly projecting end wall section 126. In this way, the battery compartment cover plate will completely fit over the opening leading to the battery compartment 110 and in effect, form a continuation of the outer surface of the lower shell 22.

Integrally formed with the battery compartment cover plate bottom wall 122 is a transversly extended locking flange 128. By further reference to FIGS. 9 and 10 of the drawings, it can be observed that the locking flange 128 will fit within a recess 130 formed in the bottom wall 40 of the lower shell 22. Moreover, the locking flange 128 is provided with a projecting tab 132 which retentively locks into a slot 134 formed within the recess 130.

In accordance with the above-identified construction, it can be observed that the user of the device merely inserts the locking flange 128 into the recess 130 such that the tab 132 will fit within the slot 134. Thereafter, the battery compartment cover plate 120 will snap fit into the closed position, as illustrated in FIGS. 9 and 10 of the drawings.

The upwardly projecting end wall section 126 is provided with a transversly extending groove 136 which receives an outwardly projecting tab 138 on the on the wall 38. This feature also provides for locking the opposite end of the battery compartment cover plate over the opening leading to the battery compartment.

It can be observed that the user of the electronic component casing of the present invention is enabled easy access to the battery compartment for changing of batteries, as may be required. However, the user of the apparatus is not capable of obtaining access to the interior compartment of the electronic enclosure casing without being aware of the generally nondisclosed means for opening the same.

Thus, there has been illustrated and described a unique end novel electronic enclosure casing which precludes opening without knowledge of a generally non-disclosed technique for opening the same and which is also provided with a unique interchangeable end wall arrangement, along with a battery compartment in which the user is provided with access. The present invention thereby fullfils all of the objects and advantages which have been sought. It should be understood that many changes, modifications, variations and other uses and applications will become apparent to those skilled in the art after considering this specification and the accompanying drawings. Therefore, any and all such changes, modifications, variations, and other uses and applications which do not depart from the spirit and scope of the invention are deemed to be covered by the invention.

Having thus described the invention, what I desire to claim and secure by letters patent is:

1. An access controlled two-shell enclosure security casing for containing electronic components or circuits or other components and which shells are not readily separable without knowing a generally non-disclosed means for separating same, said casing comprising:
   (a) a first shell having a first rim,
   (b) means forming a plurality of openings spaced along at least a portion of said first rim;
   (c) a second shell having a second rim capable of being disposed in juxtaposition to said first rim,
   (d) a plurality of hooks spaced along at least a portion of said second rim, said hooks having a thickness such that they fit into said openings and which hooks are moveable in said openings along a longitudinal dimension of said rim and said hooks being positionable in the openings where they are retentively retained in said openings and so that said two shells are lockably held together, one of said rims being somewhat yieldable enabling its transverse dimension to be changed relative to the transverse dimension of the other rim so that said hooks are transversely shiftable and readily removable from said openings thereby permitting separation of said two shells and which means of changing the transverse dimension is generally non-disclosed thereby reducing unauthorized opening of the casing.

2. The electronic enclosure casing of claim 1 further characterized in that said hooks are not lockably held in said openings until they are fully inserted into said openings and one shell is shifted relative to the other.

3. The electronic enclosure casing of claim 2 further characterized in that one of said rims is somewhat yieldable so that when two sides of said rim are squeezed together the hooks are removable from said openings.

4. The electronic enclosure casing of claim 3 further characterized in that said second rim is yieldable.

5. The electronic enclosure casing of claim 1 further characterized in that said hooks each have a first section extending outwardly toward the first shell and a second section located at approximate right angles to said first section and which is parallel to the portion of the second rim from which it extends.

6. The electronic enclosure casing of claim 5 further characterized in that each of said openings have a first elongate section sized to receive the first and second sections of a hook, said openings each have a second section perpendicularly located with respect to the first section of such opening and which is not directly open to said rim and which second section of the opening receives the second section of the hook when the latter is shifted relative to the first rim.

7. The electronic enclosure casing of claim 5 further characterized in that said plurality of hooks comprise at least one first hook and at least one second hook, said second hook having a struck tab extending toward the second rim and which is adapted to lockably hold the second shell to the first shell by precluding sliding movement of one of the shells relative to the other.

8. The electronic enclosure casing of claim 1 further characterized in that one of said shells has a recessed area initially open to an exterior of said enclosure casing and which is sized to receive a battery, and a cover section extendable over said recessed area.

9. The electronic enclosure casing of claim 8 further characterized in that said cover section extends generally continuously with and forms a continuation of the exterior surface of the shell having the recessed area.

10. The electronic enclosure casing of claim 1 further characterized in that one end of said enclosure casing is partially open and an end plate is extendable over the partially open end of the enclosure casing.

11. The electronic enclosure casing of claim 10 further characterized in that the end plate has a projecting flange extending at least about two sides of the end plate and which fits into a corresponding groove in at least one of the shells of the enclosure casing.

12. The electronic enclosure casing of claim 11 further characterized in that said end plate is captured by outer edge portions of the first and second shells and is retained in place and cannot be removed until the first and second shells are separated.

13. An electronic enclosure casing comprised of a pair of shells which are not readily separably without knowledge of a generally non-disclosed means for opening same, one of said shells having a rim with hooks thereon, the second of the shells having a rim facing the rim of the first of the shells and having openings therein, said hooks fitting into said openings in such manner that separation can only be obtained by squeezing the rims of one of the shells relative to the other to enable lateral movement of the hooks out of the openings and thereby remove the hooks from the openings and where this means of removing the hooks from the openings is not generally disclosed.

14. The electronic enclosure casing of claim 13 further characterized in that the rim of the shell having the hooks is squeezed relative to the shell having the openings.

15. The electronic enclosure casing of claim 12 further characterized in that each of said hooks each have a first section extending outwardly toward the first shell and a second section located at approximate right angles to said first section and which second section is parallel to the portion of the rim from which it extends.

16. The electronic enclosure casing of claim 15 further characterized in that each of said openings have a first elongate section sized to receive the first and second sections of a hook and a second section perpendicularly located with respect to the first section of such opening and which is not directly open to said rim and which second section of the opening receives the second section of the hook when the latter is shifted relative to the rim having the openings.

17. A method of releasably locking a two shell container together in such manner that the two shells cannot be unauthorizedly separated or opened without knowledge of a generally non-disclosed means for opening same, said method comprising:
(a) inserting hooks on one shell into openings on the other of the shells,
(b) longitudinally shifting one of the shells relative to the other to lockably retain the two shells together and where the hooks do not lockably hold the shells together until one shell is longitudinally shifted relative to the other, and
(c) squeezing the sides of one of the shells relative to the other so that the distance across the sides of the shell which is squeezed is less than that of the other shell by a dimension sufficient to allow the hooks to be released from the openings and which technique of squeezing is a generally non-disclosed technique.

18. The method of claim 17 further characterized in that said method also comprises longitudinally shifting one of the shells relative to the other in order to separate them.

19. The method of claim 18 further characterized in that said method comprises inserting one of a plurality of interchangeable end plates in an open end of said container when said two shells are locked together in such manner that the end plate is not removable without separating said two shells.

20. A two shell casing for the containment of electronic components or circuits and adaptable to housing a universal variety of different types of electronic component circuits and which may have different labelling or input/output requirements on the exterior of the casing, and which shells are not readily separable without having a generally non-disclosed means for separating same, said casing comprising:
(a) a first shell having a flat wall and an outwardly struck rim-forming side wall with a first rim thereon,
(b) means forming a plurality of openings spaced along at least a portion of said first rim;
(c) a second shell having a flat wall and an outwardly struck rim-forming side wall with a second rim adapted for juxtaposed engagement with the first rim,
(d) a plurality of hooks spaced along at least a portion of said second rim, said second hooks having a thickness such that they fit into said openings and which hooks are moveable in said openings along a longitudinal dimension of said rim and said hooks being positionable in the openings where they are retentively retained in said openings and so that said two shells are lockably held together, one of said rims being somewhat yieldable enabling its transverse dimension to be changed so that said hooks are readily removable from said openings thereby permitting separation of said two shells and which means of changing the transverse dimension is generally non-disclosed thereby reducing unauthorized opening of the casing,
(e) said rim forming side walls extending only around a portion of the periphery of the casing and leasing an opening along the side which would have been closed if the side walls were continuous,
(f) said flat wall of said second shell and a portion of the rim-forming side wall on said second shell having a groove formed therein,
(g) an end plate sized to extend over the opening along the rim-forming side wall to completely enclose the casing and which end plate has certain labeling or input/output requirements therein for a particular application, and
(h) a flange extending outwardly from said end plate and located to fit within the groove, said end plate capably of being interchangeable with another end plate having the flange and which other end plate may have other labeling or input/output requirements therein for another application.

* * * * *